United States Patent [19]

Chambers

[11] Patent Number: 4,520,093
[45] Date of Patent: May 28, 1985

[54] PHOTOSENSITIVE COMPOSITION AND METHOD FOR FORMING A NEUTRAL BLACK IMAGE

[75] Inventor: William J. Chambers, Wilmington, Del.

[73] Assignee: E. I. Du Pont de Nemours and Company, Wilmington, Del.

[21] Appl. No.: 575,062

[22] Filed: Jan. 30, 1984

[51] Int. Cl.$^3$ ................................................ G03C 5/00
[52] U.S. Cl. .................................. 430/292; 430/293; 430/294; 430/381; 430/538; 430/548
[58] Field of Search ............... 430/271, 292, 294, 381, 430/538, 548, 293

[56] References Cited

U.S. PATENT DOCUMENTS

| | | | |
|---|---|---|---|
| 2,310,943 | 2/1943 | Dorough et al. | 260/73 |
| 2,397,864 | 4/1946 | Jennings et al. | 95/2 |
| 2,397,865 | 4/1946 | Jennings | 95/7 |
| 3,904,418 | 9/1975 | Mowrey et al. | 96/73 |
| 4,137,080 | 1/1979 | Fujiwhara et al. | 96/55 |
| 4,211,561 | 7/1980 | Plambeck | 430/306 |
| 4,335,197 | 6/1982 | Chambers et al. | 430/271 |
| 4,411,987 | 10/1983 | Kobayashi et al. | 430/548 |
| 4,461,822 | 7/1984 | Abele | 430/292 |
| 4,464,463 | 8/1984 | Kojima et al. | 430/544 |

OTHER PUBLICATIONS

Tull, J. Photog. Sci., 24, 158 to 167 (1976).
"The Theory of the Photographic Process", Fourth Edition, edited by James, Macmillan Publishing Co., Inc., New York, 1977, pp. 335 to 337.

*Primary Examiner*—J. Travis Brown
*Attorney, Agent, or Firm*—James A. Costello

[57] ABSTRACT

A photosensitive composition, a photosensitive element employing said composition, and an improved photoimaging method that utilizes the disclosed composition. The improved method concerns a photosensitive element, formed from a photosensitive composition having a substrate layered with silver halide particles in operative association with a polymeric coupler, latently imaged, developed to render the imaged area insoluble, and washed to remove the undeveloped portion of the layer, wherein the improvement comprises addition of selected dispersed pigments to the polymeric coupler so that the optical density of the final image is neutral black.

19 Claims, No Drawings

PHOTOSENSITIVE COMPOSITION AND METHOD FOR FORMING A NEUTRAL BLACK IMAGE

BACKGROUND OF THE INVENTION

The photosensitive composition, element, and process of this invention appear to be classifiable in one of the following classes: 430/271 or 430/306.

The art, represented by the following publications, appears to have been indifferent to the addition of selected pigments to photosensitive compositions in such a manner as to achieve a neutral black image after exposure to actinic radiation.

U.S. Pat. No. 4,335,197 discloses a method for producing a photopolymer image on a substrate which comprises exposing to actinic radiation a photosensitive layer containing dispersed silver halide in operative association with a multifunctional polymeric coupler, developing the latent image with a monofunctional developing agent, and removing the undeveloped, soluble portion by washing with aqueous solvent. U.S. Pat. No. 4,211,561 discloses a method for producing a photopolymer image employing a multifunctional developing agent in place of the monofunctional developer of the '197 patent.

U.S. Pat. No. 2,310,943 describes the use of a polyvinyl acetal carrying phenolic color-former groups, dispersed in a gelatin/silver halide photographic emulsion. Exposure to light followed by development with a color-forming developer gave a colored image. The patent also discloses use of acetal interchange to obtain a polyvinyl acetal carrying phenolic color-former groups and carboxylic acid groups.

U.S. Pat. Nos. 2,397,864 and 2,397,865 disclose acetals and related hydrophilic polymeric color-formers as the sole film-forming carrier for silver halide in a color film. The polymeric color-former is insoluble in water at 30° C., and development is carried out with a conventional color-forming developer.

Procedures are known whereby exposed gelatin/silver halide layers are developed under conditions that cause tanning of the gelatin in the exposed areas. Such procedures have been used to prepare gelatin relief images in the imbibition printing of color pictures, e.g., Tull, *J. Photog. Sci.*, 24, 158 to 167 (1976).

U.S. Pat. No. 3,904,418 discloses the use of a polymerized monomer containing at least one active methylene group as a component of a binding agent, useful in a photographic element adapted for silver-dye bleach processes.

U.S. Pat. No. 4,137,080 discloses a process for preparing color pictures by means of light-sensitive, photographic, silver halide reproducing materials in which development occurs with a polyfunctional developing agent in the presence of a polyfunctional coupler.

For a discussion of additive and subtractive color processes, see "The Theory of the Photographic Process", Fourth Edition, edited by James, Macmillan Publishing Co., Inc., New York, 1977, pages 335 to 337 including FIG. 12.1 showing Maxwell's arrangement and FIG. 12.2 showing superimposed dyes. CL SUMMARY OF THE INVENTION This invention concerns an improved photosensitive element for photoimaging applications comprising a substrate coated with a photosensitive layer containing dispersed silver halide particles in operative association with a continuous film-forming phase of polymeric coupler, the coupler characterized by a number average molecular weight of about 2,000 to 100,000, a content of about 10 to 100 milliequivalents of coupler groups per 100 g of polymeric coupler and about 15 to 175 milliequivalents per 100 g of polymeric coupler of at least one acid group selected from carboxylic, sulfonic, and phosphonic, and the ability to couple with an oxidized p-aminodialkylaniline to become insoluble in aqueous solvents; wherein the improvement comprises said photosensitive element having dispersed therein one or more pigments of selected colors and concentrations to effect, upon photosensitization, a neutral black image characterized by an optical density imbalance of no more than about 0.5 and an optical density of at least about 2.0.

It is preferred that the optical density imbalance be no more than about 0.35. The image optical density is the sum of these optical densities: one, the coupled color coupler; two, the developed silver and; three, the added compensating pigments. Optical density measurements are made employing a conventional densitometer and standard neutral, green, blue and red filters.

This invention also concerns the photosensitive layer as a composition of matter comprising the silver halide particles, coupler and pigments described above.

The term "neutral black image" means that the (black) image has an optical density (O.D.) imbalance of no more than about 0.5 and an optical density of at least about 2.0. The term "optical density imbalance" refers to the degree of variation in optical density from neutral black toward red or green or blue. The optical density imbalance is computed as described in the last column of Table 1. Table 1 also summarizes the relationships in effect for each color of insolubilized coupler.

TABLE 1[1]

| Insolubilized Coupler Color | Principal Compensating Pigment | AgX Sensitized | O.D. Difference | O.D. Imbalance |
|---|---|---|---|---|
| Magenta | Green | Green | A(G) − A(B) | [A(G) − A(B)]/A(B) |
| Cyan | Red | Red | A(R) − A(G) | [A(R) − A(G)]/A(G) |
| Yellow | Blue | Blue | A(B) − A(R) | [A(B) − A(R)]/A(R) |

[1]A(G) = optical density green; A(B) = optical density blue; A(R) = optical density red.

The compositions of this invention are characterized in that relatively high photospeeds are obtained during imaging, even with relatively high pigment loading. This is accomplished because the silver halide employed is sensitized to absorb radiation in the wave length region corresponding to that where the principal compensating pigment transmits radiation.

It is preferred that the coupler comprise 30 to 80 meq per 100 g of polymeric coupler of coupler groups, and 20 to 165 meq per 100 g of polymeric coupler of carboxylic acid groups. Preferred couplers contain pyrazolone coupling groups and are between 5,000 and 60,000 in molecular weight. The preferred developer is 4-amino-3-methyl-N-ethyl-N-($\beta$-hydroxyethyl)aniline sulfate.

This invention also concerns an improvement in a method for forming a polymer photoimage comprising (i) exposing, imagewise, a photosensitive element to actinic radiation, the element comprising a substrate coated with a photosensitive layer containing dispersed silver halide particles in operative association with a continuous film-forming phase of polymeric coupler, the coupler characterized by a number average molecular weight of about 2,000 to 100,000, a content of about 10 to 100 milliequivalents of coupler groups per 100 g of polymeric coupler and about 15 to 175 milliequivalents per 100 g of polymeric coupler of at least one acid group selected from carboxylic, sulfonic, and phosphonic, and the ability to couple with an oxidized p-aminodialkylaniline and become insoluble in aqueous solvents:

(ii) developing the layer containing the latent image with a developing agent capable of selectively reducing the silver halide in the latent image area and, in its oxidized state, of coupling with the polymeric coupler in the latent image area, thereby insolubilizing the coupler in the form of an image; and (iii) removing the undeveloped, soluble areas of the polymeric coupler by washing with aqueous solvent;

the improvement which comprises dispersing in the photosensitive layer, before exposure to actinic radiation, pigment particles of the colors and concentrations necessary to effect, after exposure, a neutral black image.

The invention also concerns a method for forming a laminated paper proof comprising transferring the neutral black image made as described above onto a paper substrate. The invention also concerns a laminated paper proof comprising the composition of this invention characterized by a neutral black image on a paper substrate.

DETAILS OF THE INVENTION

When pyrazolone coupler groups are employed, the insolubilized coupler is magenta in color. The principal compensating pigment added is green so as to give a final black image. Silver halide is employed which is sensitized to absorb radiation in the green region of the spectrum. The optical density difference is measured between the green and blue filters, and the O.D. imbalance is no greater than about 0.5.

In a similar manner, when the insolubilized coupler is cyan in color (phenols and naphthols) the compensating pigment is red. The silver halide, is sensitized to absorb radiation in the red region of the spectrum. The optical density difference is measured between the red and green filters, and the O.D. imbalance is no greater than about 0.5. When the insolubilized coupler is yellow in color ($\beta$-ketocarboxamides, acetoacetate) the compensating pigment is blue and the silver halide is sensitized to absorb radiation in the blue region of the spectrum. The optical density difference is measured between the blue and red filters, and the O.D. imbalance is no greater than about 0.5.

The Substrate and Element Fabrication

The photosensitive elements described herein comprise coatings applied to a wide variety of substrates. By "substrate" is meant any natural or synthetic support, preferably one which is capable of existing in a flexible or rigid film or sheet form. For example, the substrate can be glass, a metal sheet or foil such as copper, aluminum, or stainless steel; a sheet or film of synthetic organic resin; cellulose paper; fiberboard; or a composite of two or more of these materials.

Other substrates include wood, cloth, and cellulose esters such as cellulose acetate, cellulose propionate, cellulose butyrate, and the like. Also suitable are films or plates composed of various film-forming synthetic resins or high polymers, such as the addition polymers, in particular the vinylidene polymers such as vinyl chloride polymers, vinylidene chloride copolymers with vinyl chloride, vinyl acetate, styrene, isobutylene, and acrylonitrile; vinyl chloride copolymers with the latter polymerizable monomers; linear condensation polymers such as the polyesters, e.g., polyethylene terephthalate; polyamides such as polyhexamethylene sebacamide; polyester amides such as polyhexamethylene adipamide/adipate, and the like.

Preferred substrates are oriented polyethylene terephthalate film, polyvinylidene chloride copolymer-coated oriented polyester film, gelatin-coated oriented polyester film, and thin and flexible grained aluminum sheets. Oriented polyester films are preferred supports for black-proofing films and lithographic films.

Fillers or reinforcing agents can be present in the synthetic resin or polymer bases, including synthetic, modified or natural fibers, e.g., cellulosic fibers such as cotton, cellulose acetate, viscose rayon and paper. Also useful are glass wool, nylon, and the like. These reinforced bases can be used in laminated form.

The photosensitive element will consist of one or more layers on the substrate. The element can also contain a top-coat or protective stratum. Such top-coats should be transparent to light and permeable to the basic developer solution, preferably soluble in an aqueous alkaline solution. The layer or layers are usually applied to the substrate as a solution of dispersion in a carrier solvent. The solution or dispersion can be sprayed, brushed, applied by a roller or an immersion coater, flowed over the surface, picked up by immersion, spin-coated, or applied to the substrate by other suitable means. The solvent is then allowed to evaporate.

In general, solvents are employed which are volatile at ordinary pressures. Examples of suitable solvents include water, aqueous ammonia, aqueous solutions containing strongly basic organic amines, and mixtures of water with water-miscible organic solvents such as methanol, ethanol, butanol, 2-methoxyethanol, 2-ethoxyethanol, 2-butoxyethanol, and the like. When the photosensitive element contains a separate silver halide layer, the polymeric coupler layer can be applied to the substrate using an organic solvent such as chlorinated hydrocarbons, ketones, or alcohols, and the silver halide emulsion is subsequently applied from an aqueous solution. Silver halide can also be applied from an alcohol dispersion by processes wherein silver halide emulsions in water are diluted with water miscible solvents like acetone to precipitate the emulsion binder, i.e., gelatin, around the AgX grains and hence break the emulsion. The gelatin coated AgX grains are then filtered and redispersed in alcohol with the assistance of salicylic acid.

The thickness of the photosensitive element after drying, is usually about 0.02 to 0.3 mil (0.5 to 7.5 $\mu$m). This thickness corresponds to a coating weight of about 5 to 80 mg/dm$^2$. When the photosensitive element is employed for the preparation of masking films, it is preferred to use a coating weight of about 10 to 50 mg/dm$^2$. Such a coating weight represents a level of silver halide of about 4 to 22 mg/dm$^2$.

The Silver Halide

The light-sensitive halide used in producing images by the process of this invention includes silver chloride, silver bromide, silver iodide, silver chlorobromide, silver iodobromide, and silver chloroiodobromide, either singly or in mixtures. Preparation of the halide can be carried out in the conventional manner in gelatin, or the halide can be formed directly in a solution of the polymeric coupler. The halide can be formed in gelatin, the gelatin removed, and the halide redispersed in a solution of the polymeric coupler. At least two equivalents of silver halide per equivalent of coupler groups are employed. In imaging systems in which all of the silver halide present is not developable, more than two equivalents of silver halide per equivalent of coupler groups may be needed, e.g., up to about fifteen equivalents.

The grain size distribution and sensitization of the silver halide can be controlled to make silver halides suitable for all classes of photographic materials including general continuous tone, X-ray, lithographic, microphotographic, direct positive, and the like. Ordinarily, the silver halide dispersions will be sensitized chemically with compounds of sulfur, gold, rhodium, selenium, and the like. They can also be sensitized spectrally with various sensitizing dyes such as cyanine, 1,1′-diethyl-4,4′-cyanine iodide, 1,1′-diethyl-2,2′-carbocyanine iodide, 1′,3-diethylthia-4′-carbocyanine iodide and other methine and polymethine cyanine dyes, kryptocyanines, merocyanines, pseudocyanines, and others.

The silver halide employed in any particular composition is sensitized to the color or radiation transmitted by the pigment. For example, when the polymeric coupler contains pyrazolone groups, green pigment is added to compensate for the magenta color formed by reaction of the coupler groups with the oxidized developing agents, and the silver halide used is sensitized to green radiation resulting in higher photospeed. As discussed above, silver halides sensitized to red and blue radiation are employed with the appropriate couplers.

The Polymeric Coupler

The polymeric coupler is present as a continuous phase in operative association with silver halide particles which are dispersed in the polymeric coupler phase itself or in a layer of binder adjacent to the polymeric coupler phase. Such a binder layer is preferably a gelatin layer overlying the polymeric coupler phase. Minor amounts of gelatin can be present in the polymeric coupler phase so long as the coupler provides the continuous phase.

Polymeric coupler molecular weights (number average) vary between about 2,000 to 100,000 as determined by gel permeation chromatography. Specific molecular weights needed for various utilities can be determined by balancing the ease of washing out the soluble areas against the need for good mechanical properties. For example, low molecular weight acetoacetate polymeric couplers are more easily removed in the soluble areas after development, but the films tend to be somewhat weak. Alternatively, high molecular weight acetoacetate polymeric couplers give films of good mechanical properties, but the soluble areas are difficult to remove by washout. When a low molecular weight polymeric coupler is employed, it should contain a relatively low concentration of acidic groups, e.g., carboxyl groups, so that imaged areas are sufficiently insoluble in aqueous solvents. Alternatively, when a high molecular weight polymeric coupler is used, a relatively high concentration of acidic groups may be required to provide adequate solubility of unimaged areas in aqueous solvents.

The coupling of oxidized developer to coupler groups in basic solution provides for an effective solubility differential between developed and undeveloped polymeric coupler in aqueous solutions. For best results, it has been found that the minimum ratio of coupler groups to acidic groups should be about 10/175 and the maximum ratio should be about 100/15.

The coupler groups can be any of the conventional coupler groups employed in color photography which are capable of coupling with an oxidized p-aminodialkylaniline to form a dye. Useful coupler groups include those having the structure

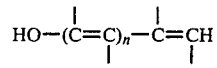

where n is 0 or 1. This structure is found in color formers which contain a reactive acyclic or intracyclic methylene group and in aromatic hydroxy compounds. These groups occur in phenols (including naphthols), amines, aminophenols, bis-phenols, acylacetarylides, cyanoacetarylides, beta-ketoesters, pyrazolones, N-homophthalylamines, coumaranones, indoxyls, thioindoxyls, and the like. The reactive groups can also be termed reactive methylene, reactive ethenol and reactive 4-hydroxy-1,3-butadienyl groups. In all of the color former nuclei the hydrogen atoms in the coupling position can be replaced by groups which are readily eliminated in the coupling reaction, including halogen such as Cl and Br, sulfonic acid, carboxylic acid, and the like. Pyrazolones are preferred coupler groups.

The coupler groups can be attached to any suitable base polymer so as to obtain the polymeric couplers of the invention. Preferred base polymers include copolymers of acrylic acid, methacrylic acid, methacrylamide, and 2-hydroxyethyl methacrylate with other conventional vinyl monomers.

Preparation of polymers which contain coupler groups is usually accomplished by copolymerization of an ethylenically unsaturated monomer which contains a coupler group such as 1-phenyl-3-methacrylamido-5-pyrazolone, or the acetoacetic ester of β-hydroxyethyl methacrylate, with such other monomers as methyl methacrylate, ethyl methacrylate, ethyl acrylate, propyl acrylate, methacrylic acid, acrylic acid, vinylphosphonic acid, vinylsulfonic acid, vinylbenzoic acid, p-vinylbenzenesulfonic acid, methacrylamide, 2-hydroxyethyl methacrylate, and the like, to provide polymers which contain pyrazolone groups or acetoacetate groups attached to the polymer chain.

The pyrazolone coupler group can be attached to a polymer chain by reaction of 1-p-aminophenyl-3-methyl-5-pyrazolone with anhydride groups in a polymer chain, e.g., with a styrene/maleic anhydride copolymer. Other useful ethylenically unsaturated monomers which contain color-forming coupler groups include m-methacrylamidophenol, 5-methacrylamido-1-naphthol, p-methacrylamidophenol, o-methacrylamidophenol, p-methacrylamidoaniline, p-methacrylamidophenylacetonitrile, 1-phenyl-3-methacrylamido-5-pyrazolone, 2,4-dimethacrylamidophenol, m-methacrylamido-α-benzoylacetanilide.

Coupler groups can be attached as lateral substituents on the main chain of a base polymer using such conventional chemical processes as esterification, amidation, etherification, acetal formation, and the like. Thus, preparation of polymers which contain ketomethylene coupler groups can be carried out by polymer substitution reactions. For example, reaction of ethyl acetoacetate with a carboxyl-containing polyvinyl alcohol in an ester exchange reaction gives a polymer which contains a plurality of ketomethylene groups. Similar reaction of carboxyl-containing polyvinyl alcohol with amino and hydroxy-substituted aromatic aldehydes gives polyvinyl acetals with attached coupler groups.

Introduction of acidic groups into the polymeric coupler is preferably accomplished by copolymerization with a acidic group-containing monomer. Acidic groups can also be obtained by selective hydrolysis of ester groups attached to the polymer chain. The necessary acidic groups can also be introduced into a preformed polymer chain by suitable known procedures, such as the sulfonation of preformed styrene copolymers. Carboxylic acid groups are preferred.

The Pigments

The pigments employed in the photosensitive element of the invention can be any of the commonly used pigments including green, blue, yellow and black. Useful organic pigments include acetoacetarylide azo pigments such as Hansa Yellows, Benzidine Yellows, and lemon yellow YT832D; pyrazolone azo pigments such as Benzidine Orange and Pyrazolone reds; β-naphthol azo pigments such as Toluidine Red; 2-hydroxy-3-naphthoic acid azo pigments such as Lithol Rubine; 2-hydroxy-3-naphtharylide azo pigments such as Naphthoic Reds; naphtholsulfonic acid azo pigments; triphenylmethane pigments and related compounds such as Methyl Violet and Victoria Blue; phthalocyanine pigments such as Monastral ® Green, Monastral ® Blue, and CI Pigment Blue 15; anthraquinone, indigoid, and related pigments such as Perylene Reds; quinacridone pigments; dioxazine pigments; azamethine pigments; fluorubine pigments; and naphthindolizinediene pigments. Carbon black is preferred as a black pigment.

A further discussion of operable organic pigments is included in the chapter, "Organic Pigments", by Lenoir in "The Chemistry of Synthetic Dyes", Vol. V, edited by Venkataraman, Academic Press, New York, 1971, pages 313 to 474; see page 328 relative to the classification of organic pigments presented in the preceding paragraph.

The amount of the individual pigments added to achieve the required neutral black image at the minimum optical density can vary widely between zero and about 24% of coating weight. Preferably, a maximum of about 34% of total pigment based on coating weight is employed to insure adequate absorption of radiation by the photosensitive layer with the relatively low quantity of silver halide used. Typically, pigments are ground to a particle size of about 40 to 60 $\mu$m.

It is often advantageous to incorporate the pigments in the polymeric coupler phase which can, in turn, be overcoated with a photosensitive silver halide layer. The silver halide is most conveniently carried in an unhardened gelatin layer. With such an arrangement, essentially all of the light used for exposure is available to the silver halide and none is lost through absorption by colorant. During development, the oxidized developing agent diffuses into the colored polymeric coupler phase to effect insolubilization.

In addition to the pigments added to achieve a neutral black image at low carbon black level, the polymeric coupler phase can contain the usual sensitizers and sensitizing dyes used for conventional silver halide emulsions. The photosensitive element can also contain various conventional photographic additives such as coating aids like saponin, alkylarylsulfonic acids or sulfoalkylsuccinic acids; plasticizers such as glycerol or 1,5-pentanediol; antistatic agents; agents to prevent the formation of spots, antihalation colorants; and the like.

The photosensitive composition/element of this invention are particularly useful for the preparation of masking films such as black proofing films and lithographic films. The photosensitive elements are characterized by relative oxygen-insensitivity and fast speed. Furthermore, a neutral black image is obtained with low silver halide content and a minimum amount of added carbon black without sacrifice in speed. The low carbon black level permits imaging from the coated side of the element. With conventional elements employing relatively high levels of carbon black, imaging through the base is usually required to get sufficient anchorage of the layer to the support.

Exposure (Step (i))

Imagewise exposure of the photosensitive layer is conveniently carried out by exposing the layer by any of the usual procedures used with silver halide photographic materials, including camera, cathode ray tube, light emitting diode, projection, contact or laser processes. Laser imaging is best done with compositions using silver halide spectrally sensitized to the laser output wavelength. Spectral sensitization can improve silver halide light absorption at desired wavelengths.

In most applications, the original copy used for camera exposure will consist of black and white areas only; or, if used for contact or projection printing, it will consist of opaque and clear areas (process transparency). Exposures are normally made directly onto the photosensitive element. However, when high concentrations of colorant are present in the silver halide-containing layer, exposure can be made through a transparent substrate to provide proper anchorage of the image to the substrate. When the photosensitive element contains a pigmented polymeric coupler layer and a separate superior silver halide emulsion layer, exposure can be made directly onto the silver halide layer. If an appropriate concentration of light-absorbing dye or pigment is present throughout the thickness of the photosensitive element so that the light is attenuated as it passes through the element, exposure to continuous tone copy can be made through the transparent support. Alternatively, the exposed and developed layer can be transferred to another support before removing the undeveloped, soluble areas. The image obtained is of varying thickness and continuous tone.

The Developer and Step (II)

The developing agent can be of the monofunctional type which contains one group capable of selectively reducing a silver halide latent image and (in its oxidized state) capable of coupling with the coupler groups of the polymeric coupler. The polymeric couplers are insolubilized after exposure by treatment with the monofunctional developing agent in basic solution. The acidic groups of the polymeric coupler, in both imaged and unimaged areas, are concurrently converted to ionic salt groups by reaction with base in the developer solution. Since the coupler groups are attached to the polymer chains, insolubilization of the polymer chains in aqueous solvents, in the imaged areas, takes place as a result of the coupling reaction.

An essential requirement of the coupling reaction between the oxidized monofunctional developer and the polymeric coupler is that it forms a polymer image relatively insoluble in aqueous solvents compared with undeveloped polymeric coupler.

Preferred classes of monofunctional developing agents contemplated for use in this invention are disclosed in U.S. Pat. No. 4,335,197 and include those having as their nucleus an active group of the formula:

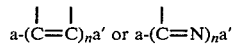

where a and a', alike or different, are OH, NH$_2$, NHR, or NR$_2$ with the proviso that at least one of a or a' is a primary amino group; n is an integer from 1 to 4; the R groups, alike or different, are alkyl groups of 1 to 6 carbon atoms or substituted alkyl groups. Preferred developing agents include p-phenylenediamines in which one amino function is primary and the other is substituted with two alkyl groups, p-aminophenols, amino-substituted hydroxypyrazoles, and aminopyrazolines.

Suitable monofunctional developing agents include:
4-amino-3-methyl-N-ethyl-N-($\beta$-hydroxyethyl)aniline,
N,N-diethyl-p-phenylenediamine,
4-amino-3-methyl-N,N-diethylaniline,
4-amino-N-ethyl-N-($\beta$-methylsulfonylaminoethyl)aniline, 4-amino-N-ethyl-N($\beta$-hydroxyethyl)aniline,
4-amino-3-chloro-N,N-diethylaniline,
4-amino-3-ethoxy-N,N-diethylaniline,
4-amino-N-ethyl-N-methylaniline,
4-amino-N-ethyl-N-propylaniline,
1-(p-aminophenyl)3-amino-$\Delta^2$-pyrazoline,
1,3-dimethyl-4-amino-5-hydroxypyrazole,
o-aminophenol,
o-phenylenediamine,
p-aminophenol, and
p-phenylenediamine.

The developing agent can also be of the polyfunctional type that contains a minimum of two groups capable of selectively reducing a silver halide latent image and, in their oxidized state capable of coupling with the coupler group of the polymeric coupler. When a polyfunctional developing agent is employed, the coupling reaction results in formation of a cross-linked polymer image.

Preferred classes of polyfunctional developing agents are disclosed in U.S. Pat. No. 4,211,561 and include those having the general formula $$D^1-A^1-D^2$$

in which $D^1$ and $D^2$, alike or different, each denote a substituted or unsubstituted monovalent p-aminophenol or p-phenylenediamine radical attached to $A^1$ through a nitrogen or carbon atom of the radical, and $A^1$ represents a single bond or a divalent organic radical selected from the group consisting of alkylene, arylene, oxydialkylene, oxydiarylene, alkylarylene, arylalkylene, and a radical which contains a divalent p-aminophenol or p-phenylenediamine radical; and when $D^1$ and $D^2$ are attached to $A^1$ through a carbon atom, $A^1$ additionally includes sulfide, ether, amino, amide, alkylamino, acyl and carbonyl.

Examples of suitable polyfunctional developing agents include:
N,N'-bis($\beta$-hydroxyethyl)-N,N'-bis[4-amino-3-methyl)-phenyl]tetramethylenediamine,
N,N'-dimethyl-N,N'-bis(4-aminophenyl)trimethylenediamine,
N,N'-bis[(4-amino-3-methyl)phenyl]-N,N'-(dimethyl)ethylenediamine,
$\beta,\beta'$-oxybis[$\beta$-(N-ethyl-4-aminoanilino)ethyl]ether,
N,N'-bis($\beta$-hydroxyethyl)-N,N'-bis[(4-amino)phenyl]ethylenediamine,
1,2-bis[(2,5-diamino)phenyl]ethane,
2,2'-bis(dimethylamino)-5,5'-diaminobiphenyl,
N-[2-(N,N-diethylamino)-5-aminophenethyl]-2-amino-5-(N,N-diethylamino)-N-phenylaniline,
2-[$\beta$-{2-amino-5-(N,N-diethylamino)phenoxy}-ethyl]-4-amino-N,N-diethylaniline,
bis(2-hydroxy-5-aminobenzyl)amine,
2,2'-methylenebis(4-aminophenol),
N-(2'-hydroxy-5'-aminophenyl)-2-hydroxy-5-aminobenzylamine,
3-methyl-4-amino-N-ethyl-N-(2-hydroxy-5-aminobenzyl)aniline,
2,2'-oxybis(4-amino-6-methylphenol),
5-aminosalicylic acid(2-amino-5-hydroxy)anilide,
2,2'-disulfidebis(4-aminophenol), and
2,6-bis(2-hydroxy-3-methyl-5-aminobenzyl)-3,5-dimethyl-4-aminophenol.

The developing agent can be employed in a developer solution comprising developing agent in water or water-soluble organic solvents. The developing agent can also be incorporated in the photosensitive element itself as a subcoating, topcoating, or it can be mixed with the polymeric coupler to provide an integral structure containing the developing agent. When the developing agent is incorporated in the photosensitive layer, it is generally advantageous to utilize a protected developer or developer precursor, i.e., a masked developer, so that the premature oxidation and reaction of the developer is prevented. Acid salts of the developing agent are also suitable for use. Such developers are known in the art and are discussed in "The Theory of the Photographic Process", pages 325 and 326, vide supra. In this case, the solution employed in the developing step (b) is an activator solution (for the developing agent) such as aqueous base.

The developer solutions can contain conventional additives. For example, alkaline agents such as sodium hydroxide, ammonium hydroxide, potassium carbonate, potassium bicarbonate, and sodium carbonate are useful as development accelerators. Sodium sulfite can be employed to improve storage stability. Conventional developer superadditives such as 1-phenyl-3-pyrazolidone and N-methyl-p-aminophenol can also be employed. The superadditive can be added directly to the developer solution or it can be incorporated within the photosensitive element.

Alternatively, when the developing agent is incorporated in the photosensitive element, the superadditive can be added to the activator solution. Sodium sulfate can be used as a swelling suppressant; hydroxylamine salts and sodium sulfite are used as antioxidants; antifoggants include 6-nitrobenzimidazole salts and alkali metal halides such as potassium bromide; solubilizing agents include benzyl alcohol, 2-ethoxyethanol, 2-methoxyethanol, 2-butoxyethanol and 2-(2-butoxyethoxy)e- thanol. Water softeners, wetting agents, pH buffers and the like can also be present. The pH of the developer solutions is preferably about 9 to 12.5, most preferably about 9.4 to 11.5.

The pH and salt content of the developer solutions are adjusted so that swelling but not dissolution of the photosensitive layer occurs during the developing step. When a water-insoluble polymeric coupler is used, the pH of the developer solution is increased and the salt concentration is adjusted so that swelling but not dissolution of the polymeric layer occurs.

The quantity of developing agent employed is not critical. When developer solutions are employed, the developing agent usually amounts to about 0.1 to 10 g/L of solution, preferably about 0.25 to 4 g/L. The ratio of developing agent to polyfunctional coupler is not critical, but sufficient developing agent should be present to effect satisfactory coupling and insolubilization. Preferably, at least 1.0 mole of developing agent for each equivalent of coupler group is employed.

Washout (Step (iii))

The undeveloped, soluble areas of the polymeric coupler layer are removed by washing with water, an aqueous solution of solids such as alkali metal carbonates, hydroxides, silicates, phosphates, sulfates, and halides, or a semiaqueous solution of water and a water-miscible organic solvent. Suitable organic solvents include methanol, ethanol, 2-propanol, 2-ethoxyethanol, 2-butoxyethanol, 2-(butoxyethoxy)ethanol, and glycerol. Spray washout and brushing are preferred for removal of the undeveloped areas. When a separate silver halide emulsion layer is employed, this entire layer can be removed during the washing step.

For certain applications, one or more conventional finishing steps can be employed. Such steps include fixing after development or before or during washout, treatment with an oxidizing agent, acid treatment, hardening with polyvalent metal ions such as calcium, magnesium or borate ions, treatment with surface active agent, and the like. The element is dried in a conventional manner.

The method of this invention provides a water-soluble polymeric relief image with good resolution over a wide range of exposure speeds including camera speeds. In addition, the process is operable with silver halide coating weights as low as about 2 mg/dm$^2$. This method can be employed for the preparation of both negative and positive images. In the preparation of a negative image, the areas insolubilized correspond to the areas exposed to light, whereas for a positive image, the areas insolubilized correspond to the unexposed areas. The type of image obtained depends on the character of the silver halide used. Thus, a normal negative-working silver halide yields a negative polymer image while a positive-working silver halide, such as one prepared by well-known solarization or chemical fogging techniques, yields a positive polymer image.

EXAMPLES

The following Examples illustrate the invention. All part and percentages are by weight, and all degrees are Celsius unless otherwise noted.

EXAMPLE 1

The Photosensitive Element

A. Pyrazolone Polymeric Coupler Preparation

An acrylic copolymer containing pyrazolone coupler groups was prepared by heating at reflux for 8 hr a t-butyl alcohol solution of a mixture of 64 g of ethyl acrylate, 15 g of methyl methacrylate, 9 g of methacrylic acid and 12 g of 1-phenyl-3-methacrylamido-5-pyrazolone in the presence of 0.4 g of azobisisobutyronitrile initiator, added in portions. The solution was poured into water in a blender to precipitate the polymer. The polymer was collected on a filter, washed well with water, and dried at about 40° under vacuum. The number average molecular weight by Gel Permeation Chromatography (GPC) was about 26,000. The polymer contained 49 meq of coupler groups and 105 meq of carboxyl groups per 100 g of polymer.

The 1-phenyl-3-methacrylamido-5-pyrazolone was prepared by acylation of 1-phenyl-3-amino-5-pyrazolone with an excess of methacrylyl chloride at 40° in pyridine by the following procedure. To a 500 mL three-necked flask fitted with a stirrer and thermometer there were added 35 g (0.2 mol) of 1-phenyl-3-amino-5-pyrazolone and 200 ml of dry pyridine. The mixture was stirred and the temperature held at 40° to 42°, and 42 g (0.4 mol) of methacrylyl chloride was added dropwise. After completion of the addition, the mixture was warmed to 75°. It was then poured onto cracked ice and allowed to stand overnight. The product was filtered on a suction filter, washed with water and then recrystalized from methanol.

B. Polymer Solution

A mixture of 38.4 of pyrazolone coupler polymer of Part A, 2.3 mL of concentrated aqueous ammonia and 260 mL of distilled water was rolled for 16 hr to give a clear light-yellow polymer solution.

C. Pigment/Polymer Dispersion

The pigment dispersions were prepared by sand grinding the pigments in a solution of coupler polymer in aqueous ammonia. The ammonia salt of the coupler polymer was the dispersing agent. It also was a foaming agent and care was taken to prevent excess foaming. Polymer solution of Part B, 110 g (12.8% solids), was placed in a 250 mL stainless steel beaker equipped with a 0.32 cm×3.8 cm disc stirrer. To the solution in the beaker was added slowly 4.6 g of Monastral ® Green G, 1.0 g of lemon yellow YT832D (50% solids), and 1.8 g of carbon black (Degussa "Printex U" beads), while stirring was continued at low speed. As soon as the pigments were wetted, 83 mL of 20/30 mesh sand was added slowly to allow entrapped air to escape. The mixture was then sand-ground with ice/water cooling at about 3500 rpm for 85 min. The sand was removed on a coarse fritted glass filter. There was obtained 105 g of the desired pigment dispersion.

D. Emulsion Preparation and Coating

The coating formulation was prepared by warming 20.9 g of a silver halide dispersion (11.9% solids) in water consisting of 10% ortho-sensitized, negative-working AgBr$_{0.985}$I$_{0.15}$ grains with an average equivalent edge size of 0.28 μm (or 0.02 μm$^3$ volume), and then mixing it with 20.0 g of the pigment/coupler polymer dispersion of Part C. The mixture was stirred for a few minutes. The coating formulation was coated onto an 102-μm oriented polyester film, which had an antihalation backing, using a doctor knife. The coating was air-dried for 10 to 15 min at about 20° and then dried in hot air at about 70° to 75° for 5 to 10 min. The dried coating had a coating weight of 22 mg/dm².

Developer Solutions

Developer solutions were prepared by the following procedure. Reagents were dissolved in distilled water, under nitrogen, in the following order:
potassium bromide (KBr)
sodium sulfate ($Na_2SO_3$)
hydroxylamine hydrochloride ($NH_2OH.HCl$)
4-amino-3-methyl-N-ethyl-N-(β-hydroxyethyl)aniline sulfate (CD-4)
potassium carbonate ($K_2CO_3$)
potassium bicarbonate ($KHCO_3$).
The developer solutions prepared by this procedure are summarized in Table 2.

TABLE 2

| Developer Designation | Component Parts | | | | | |
|---|---|---|---|---|---|---|
| | $H_2O$ | KBr | $Na_2SO_3$ | $NH_2OH.HCl$ | CD-4 | $K_2CO_3$ | $KHCO_3$ |
| M30 | 837 | 0.10 | 25.00 | 25.00 | 5.00 | 54.00 | 54.00 |
| M33 | 862 | 0.40 | 5.00 | 20.00 | 5.00 | 54.00 | 54.00 |
| M37 | 862 | 0.40 | 5.00 | 20.00 | 5.00 | 84.00 | 24.00 |
| M38 | 862 | 0.40 | 5.00 | 20.00 | 5.00 | 128.00 | 54.00 |

Exposure, Development and Washout

The coated films were contact-exposed in a vacuum frame through a process transparency using an incandescent lamp (10 ft-candles (108 lm/m²) at 30.5 cm) placed 1.4 m from the film surface. The exposure time was 16 sec. In other experiments, films were exposed in projection mode using a process camera.

After exposure, the films were immersed in developer solution M30 and developed for 2 minutes at room temperature with gentle agitation. The films were removed from the developer solution and spray-washed with an air/water spray from a paint sprayer gun at about 275 kPa to remove unexposed areas. The films were air dried.

Density Measurements

The density measurements were made on a MacBeth model TR-524 densitometer in the transmission mode. The filters were neutral (visual, Wratten #106), blue (Wratten #94), green (Wratten #93), and red (Wratten #92).

The various optical densities of Example 1 were found to be: neutral, 2.6; blue, 2.5; green, 2.6; red, 2.7. The optical density imbalance was computed as follows: (green-blue)/blue=0.04. These measurements indicate a highly balanced optical density image.

EXAMPLES 2 TO 18

These Examples were carried out using the general procedure described for Example 1. In each Example, 110 g (12.8% solids) of polymer Solution B of Example 1 was employed. In Table 3 are summarized the variables of pigment composition, developer and development time. The column designations are as follows: 1, g of Monastral ® Green G; 2, g of lemon yellow YT832D solution (50% solids); 3, g of Monastral ® Blue; 4, g of carbon black; 5, coating weight in mg/dm², 6, exposure time in sec; 7, development time in min; 8, developer used.

TABLE 3

| Example | 1 | 2 | 3 | 4 | 5 | 6 | 7 | 8 |
|---|---|---|---|---|---|---|---|---|
| 2 | 4.6 | 1.0 | 0.0 | 1.8 | 22 | 8 | 3 | M30 |
| 3 | 5.0 | 2.0 | 0.0 | 1.9 | 30 | 8 | 3 | M38 |
| 4 | 4.6 | 1.0 | 0.5 | 1.9 | 24 | 10 | 2 | M38 |
| 5 | 4.6 | 1.0 | 0.0 | 1.8 | 22 | 8 | 3 | M37 |
| 6 | 4.6 | 1.0 | 0.0 | 1.8 | 27 | 16 | 3 | M33 |
| 7 | 4.6 | 1.0 | 0.5 | 1.9 | 24 | 8 | 4 | M37 |
| 8 | 3.7 | 0.0 | 0.0 | 2.4 | 25 | 32 | 3 | M30 |
| 9 | 5.3 | 0.0 | 0.0 | 1.7 | 27 | 16 | 3 | M30 |
| 10 | 2.6 | 1.5 | 0.0 | 1.3 | 25 | 32 | 3 | M30 |
| 11 | 5.3 | 0.0 | 0.0 | 1.7 | 22 | 16 | 3 | M30 |
| 12 | 4.4 | 0.0 | 0.0 | 1.8 | 32 | 16 | 3 | M30 |
| 13 | 2.6 | 1.5 | 0.0 | 1.3 | 25 | 8 | 3 | M30 |
| 14 | 4.4 | 0.0 | 0.0 | 1.8 | 24 | 8 | 3 | M30 |
| 15 | 1.4 | 2.8 | 0.0 | 1.5 | 20 | 30 | 3 | M30 |
| 16 | 3.7 | 0.0 | 0.0 | 2.4 | 30 | 32 | 3 | M30 |
| 17 | 4.4 | 0.0 | 0.0 | 1.8 | 24 | 16 | 3 | M30 |
| 18 | 2.6 | 1.5 | 0.0 | 1.3 | 25 | 16 | 3 | M30 |
| Control A | 0.0 | 0.0 | 0.0 | 6.0 | 24 | 16 | 3 | M38 |
| Control B | 0.0 | 0.0 | 0.0 | 3.9 | 20 | 20 | 3 | M30 |

The optical density measurements of Examples 2 to 18 and Controls A and B are summarized in Table 4. Column designations are as follows: 1, neutral; 2, blue; 3, green; 4, red; 5, (green-blue)/blue (imbalance).

TABLE 4

| Example | (Optical Densities)[1] | | | | |
|---|---|---|---|---|---|
| | 1 | 2 | 3 | 4 | 5 |
| 2 | 2.3 | 2.3 | 2.2 | 2.4 | −0.04 |
| 3 | 2.7 | 2.8 | 2.8 | 2.7 | 0.0 |
| 4 | 2.8 | 2.6 | 2.8 | 2.8 | 0.08 |
| 5 | 2.2 | 1.9 | 2.1 | 2.0 | 0.11 |
| 6 | 2.2 | 2.0 | 2.3 | 2.1 | 0.15 |
| 7 | 2.3 | 2.0 | 2.4 | 2.1 | 0.20 |
| 8 | 2.3 | 2.1 | 2.6 | 1.8 | 0.24 |
| 9 | 2.6 | 2.0 | 2.7 | 2.4 | 0.35 |
| 10 | 3.0 | 2.6 | 3.5 | 2.4 | 0.35 |
| 11 | 2.4 | 1.8 | 2.6 | 2.2 | 0.44 |
| 12 | 2.7 | 2.1 | 3.0 | 2.3 | 0.43 |
| 13 | 2.7 | 2.3 | 3.2 | 2.1 | 0.39 |
| 14 | 2.5 | 2.0 | 2.9 | 2.2 | 0.45 |
| 15 | 2.7 | 2.7 | 3.7 | 1.9 | 0.37 |
| 16 | 2.9 | 2.8 | 3.9 | 2.3 | 0.39 |
| 17 | 2.1 | 1.6 | 2.4 | 1.8 | 0.50 |
| 18 | 2.9 | 2.4 | 3.6 | 2.2 | 0.50 |
| Control A | 1.6 | 1.2 | 1.9 | 1.6 | 0.58 |
| Control B | 1.9 | 1.8 | 3.2 | 1.2 | 0.78 |

[1]Column 5 shows O.D. Imbalance

EXAMPLE 19

Laminated Paper Proof

A portion of the composition of Example 3 was coated onto an oriented polyester film to give a coating weight of 24 mg/dm². The coated film was exposed for 10 sec to the standard exposure source, and the exposed film was developed with developer M38 for 2 min, spray-washed, and air-dried. The dried film was laminated to a glossy proofing paper at 100° and 0.2 m/min in a commercial photo-resist laminator. The resulting paper proof showed a sharp, glossy image. A good resolution of 1 to 99% dots (59 lines/cm screen) was achieved.

EXAMPLE 20

This Example describes how one could prepare and image a composition/element of this invention employing a polyfunctional developer.

A. Preparation of Polymeric Coupler

An acrylic copolymer containing pyrazolone coupler groups can be prepared as described in Example 8 of U.S. Pat. No. 4,211,561, by heating at reflux for 8 hours a t-butyl alcohol solution of a mixture of 43 parts of ethyl acrylate, 35 parts of methyl methacrylate, 10 parts of methacrylic acid and 12 parts of 1-phenyl-3-methacrylamido-5-pyrazolone in the presence of 0.4 part of azobisisobutyronitrile initiator, added in portions. This solution is poured into water to precipitate the copolymer, and the precipitated copolymer is steamed to remove volatiles. The number average molecular weight measured by gel permeation chromatography is approximately 32,000 using polymethyl methacrylate standards. A polymer solution is prepared by dissolving 10 g of the copolymer in 85 g of water and 5 mL of concentrated ammonia.

B. Pigment/Polymer Dispersion

A pigment dispersion of the polymer solution of Part A can be prepared using the procedure described in Example 1, Part C. By this procedure, a pigment/polymer dispersion containing added Monastral® Green G, lemon yellow YT832D, and carbon black can be obtained.

C. Emulsion Preparation and Coating

Under photographic safelights, a light-sensitive silver halide emulsion can be prepared by combining two parts of the pigment/polymer dispersion of Part B with one part of silver halide dispersion in water. The mixture is filtered and spincoated onto tared glass plates, an oriented polyester film having a subcoating of a vinylidene chloride copolymer, and grained aluminum plates, both silicate-treated and anodized types. The coating weights, measured on the glass plates, will be in the range of about 20 to 24 mg/dm$^2$.

D. Exposure and Processing

First, a developer stock solution is prepared by mixing 0.5 g of potassium pyrosulfite and 1.0 g of N,N'-bis($\beta$-hydroxyethyl)-N,N'-bis[(4-amino-3-methyl)-phenyl]tetramethylenediamine hydrochloride with sufficient water to give 20 mL of solution. A working developer solution is prepared by combining 0.5 mL of the developer stock solution, 1.5 mL of water, and 8.0 mL of a solution prepared by mixing 50 g of sodium carbonate and 0.5 g of sodium sulfite dissolved in sufficient water to give 400 mL of solution.

A coated anodized aluminum plate of Part C is exposed for 8 seconds to a 15-watt tungsten lamp at a distance of 76 cm using an Air Force resolution-test process transparency. The exposed plate is developed for 2 minutes in the working developer solution modified by the addition of 15 mL of 0.1N potassium bromide solution/100 mL of developer solution. The plate is washed with water and dried to give a clear sharp black image.

EXAMPLE 21

This Example describes how one could practice this invention employing an acetoacetate polymeric coupler.

A. Preparation of Acetoacetate Polymeric Coupler

An acrylic copolymer containing acetoacetate coupler groups can be prepared as described in Example 1 of U.S. Pat. No. 4,335,197. For instance, a solution of 1.60 g of a phosphate ester anionic surfactant in acid form in 30 mL of distilled water is titrated to pH 7 with 2% sodium hydroxide solution. Distilled water is added to give a total of 163 g of solution. The solution is placed in a flask equipped with a stirrer, condenser, thermometer and nitrogen inlet tube, and nitrogen is bubbled through the solution to remove oxygen. The flask is placed in a 60° water bath, and 0.20 g of potassium peroxydisulfate is added with slow stirring.

The solution is next stirred at high speed while a monomer solution consisting of 4.00 g of the acetoacetic ester of $\beta$-hydroxyethyl methacrylate, 14.00 g of methyl methacrylate, 18.00 g of ethyl acrylate, 4.00 g of methacrylic acid, and 0.20 g of lauryl mercaptan, is added. High speed stirring is continued for an additional 0.5 min, then the stirring speed is reduced to low speed while the polymerization emulsion is heated at 57° to 64° for 1.0 hr. The water bath is removed and 0.20 g of sodium bisulfite is added. The mixture is stirred for 10 min and filtered through a coarse fritted glass filter. There is obtained 191 g of acetoacetate polymeric coupler emulsion of pH of 5.2 and a solids content of 22%. The number average molecular weight is found to be 44,000 by GPC. Coupler groups; 47 meq/100 g of polymeric coupler; carboxyl groups; 116 meq/100 g of polymeric coupler.

B. Pigment/Polymer Dispersion

A pigment dispersion of the polymer emulsion of Part A can be prepared by sand-grinding the pigments in a solution of coupler polymer in aqueous ammonia as described in Example 1, Part C. In the instant Example, a mixture of Monastral® Blue (at about 0.1 the concentration of Monstral® Green used in Example 1) and carbon black would be employed.

C. Emulsion Preparation and Coating

A silicate-coated anodized aluminum plate can be spin-coated with a mixture of about 8.1 g of the pigment/polymer dispersion of Part B and 13.5 g of a silver halide dispersion of Example 1D. After drying, the coating weight is about 10 mg/dm$^2$.

Developer Solution

Developer solution can be prepared by the following procedure. Reagents are mixed, under nitrogen, in the following order:

0.8 mL of 5% potassium bromide in distilled water,
1.0 mL of 5% sodium sulfite in distilled water,
0.4 mL of 2.5% 2-phenyl-4-methyl-4-hydroxymethyl-5-pyrazolidone (Dimezone-S) in 1/1 methanol/water, and
89.7 mL of distilled water.

Nitrogen is bubbled through the solution for 5 minutes, and then the following reagents are added:

0.10 g of 4-amino-3-methyl-N-ethyl-N-($\beta$-hydroxyethyl)aniline sulfate,
4.00 g of potassium bicarbonate, and 4.00 g of potassium carbonate.

D. Exposure, Development and Washout

The coated plates can be contact-exposed through a process transparency which contains 2%, 5%, 50%, 95% and 98% 150 line halftone dots for 2, 4, and 8 sec using an incandescent lamp at a distance of 46 in (117 cm). The lamp is adjusted to give radiation of 10 ft-candles (108 1 m/m$^2$) at 12 in (30.5 cm) distance. After exposure, the plates are immersed in the developer solution for 3.0 min at 32°. The plates are spray-washed with water to remove unexposed areas. A sharp hydrophobic, neutral black polymer image will remain in the exposed areas.

The embodiments of the invention in which an exclusive property or privilege is claimed are defined as follows:

1. In a photosensitive element for photoimaging applications comprising a substrate coated with a photosensitive layer containing dispersed silver halide particles in operative association with a continuous film-forming phase of polymeric coupler, the coupler characterized by a number average molecular weight of about 2,000 to 100,000, a content of about 10 to 100 milliequivalents of coupler groups per 100 g of polymeric coupler and about 15 to 175 milliequivalents per 100 g of polymeric coupler of at least one acid group selected from carboxylic, sulfonic, and phosphonic, and the ability to couple with an oxidized p-aminodialkylaniline to become insoluble in aqueous solvents;

the improvement which comprises said photosensitive element having compensating pigments dispersed therein, as well as silver halide, the pigments being of selected colors and concentrations to effect, upon photosensitization, a neutral black image characterized by an optical density imbalance of no more than about 0.5 and an optical density of at least about 2.0; the silver halide being sensitized to absorb radiation in the wave length region corresponding to that where the principal compensating pigment transmits radiation.

2. A photosensitive element according to claim 1 wherein the polymeric coupler contains acetoacetate coupling groups.

3. A photosensitive element according to claim 1 wherein the polymeric coupler contains pyrazolone coupling groups.

4. A photosensitive element according to claim 1 wherein the substrate is oriented polyethylene terephthalate film.

5. A photosensitive element according to claim 1 wherein the molecular weight of the polymeric coupler is about 5,000 to 60,000.

6. A photosensitive element according to claim 1 having pigments dispersed therein that will effect, upon photosensitization, a neutral black image having an optical density imbalance of no more than about 0.35.

7. A photosensitive element according to claim 5 wherein the coupler comprises 30 to 80 meq of coupler groups per 100 g of polymeric coupler and 20 to 165 meq of carboxylic acid groups per 100 g of polymeric coupler.

8. A photosensitive element according to claim 7 wherein the polymeric coupler comprises pyrazolone coupler groups.

9. A photosensitive element according to claim 8 wherein the substrate is oriented polyethylene terephthalate film.

10. In a photosensitive composition comprising dispersed silver halide particles in operative association with a continuous film-forming phase of polymeric coupler, the coupler characterized by a number average molecular weight of about 2,000 to 100,000, a content of about 10 to 100 milliequivalents per 100 g of polymeric coupler of coupler groups and about 15 to 175 milliequivalents per 100 g of polymeric coupler of at least one acid group selected from carboxylic, sulfonic, and phosphonic, and the ability to couple with an oxidized p-aminodialkylaniline to become insoluble in aqueous solvents;

the improvement which comprises said photosensitive element having compensating pigments dispersed therein, as well as silver halide, the pigments being of selected colors and concentrations to effect, upon photosensitization, a neutral black image characterized by an optical density imbalance of no more than about 0.5 and an optical density of at least about 2.0; the silver halide being sensitized to absorb radiation in the wave length region corresponding to that were the principal compensating pigment transmits radiation.

11. A laminated paper proof comprising a composition according to claim 10 on a paper substrate.

12. In a method for forming a photoimage comprising
   (i) exposing, imagewise, a photosensitive element to actinic radiation, the element comprising a substrate coated with a photosensitive layer containing dispersed silver halide particles in operative association with a continuous film-forming phase of polymeric coupler, the coupler characterized by a number average molecular weight of about 2,000 to 100,000, a content of about 10 to 100 milliequivalents of coupler groups per 100 g of polymeric coupler and about 15 to 175 milliequivalents per 100 g of polymeric coupler of at least one acid group selected from carboxylic, sulfonic, and phosphonic, and the ability to couple with an oxidized p-aminodialkylaniline and thereby become insoluble in aqueous solvents;
   (ii) developing the layer containing the latent image with a developing agent capable of selectively reducing the silver halide in the latent image area and, in its oxidized state, of coupling with the polymeric coupler in the latent image area, thereby insolublizing the coupler in the form of an image; and
   (iii) removing the undeveloped, soluble areas of the polymeric coupler by washing with aqueous solvent;

the improvement which comprises dispersing in the photosensitive layer, before exposure to actinic radiation, compensating pigments of the color and concentration to effect, after exposure, a neutral black image, and sensitizing the silver halide to absorb radiation in the wave length region corresponding to that where the principal compensating pigment transmits radiation.

13. A method according to claim 12 wherein the polymeric coupler contains acetoacetate coupling groups.

14. A method according to claim 12 wherein the polymeric coupler contains pyrazolone coupling groups.

15. A method according to claim 12 wherein the substrate is oriented polyethylene terephthalate film.

16. A method according to claim 12 wherein the molecular weight of the polymeric coupler is about 5,000 to 60,000.

17. A method according to claim 16 comprising employing a coupler having 30 to 80 meq of coupler groups per 100 g of polymeric coupler and 20 to 165 meq of carboxylic acid groups per 100 g of polymeric coupler.

18. A method according to claim 17 employing a coupler comprising pyrazolone coupler groups and an oriented polyethylene terephthalate film substrate.

19. A method for making a laminated paper proof comprising transferring the photosensitive composition of claim 10 onto a paper substrate.

* * * * *